United States Patent
Deutschmann et al.

(10) Patent No.: US 7,095,258 B2
(45) Date of Patent: Aug. 22, 2006

(54) CIRCUIT ARRANGEMENT FOR THE PROVISION OF AN OUTPUT SIGNAL WITH ADJUSTABLE FLANK PITCH

(75) Inventors: Bernd Deutschmann, Graz (AT); Gottfried Fraiss, Veitsch (AT)

(73) Assignee: Austriamicrosystems AG, Unterpremstatten (AT)

( * ) Notice: Subject to any disclaimer, the term of this patent is extended or adjusted under 35 U.S.C. 154(b) by 0 days.

(21) Appl. No.: 10/499,927

(22) PCT Filed: Dec. 11, 2002

(86) PCT No.: PCT/EP02/14067

§ 371 (c)(1),
(2), (4) Date: Jun. 18, 2004

(87) PCT Pub. No.: WO03/055071

PCT Pub. Date: Jul. 3, 2003

(65) Prior Publication Data

US 2005/0093589 A1    May 5, 2005

(30) Foreign Application Priority Data

Dec. 21, 2001  (DE) ................................ 101 63 461

(51) Int. Cl.
*H03B 1/00*   (2006.01)
(52) U.S. Cl. ....................... 327/130; 327/112
(58) Field of Classification Search ............... 327/108, 327/112, 126, 130–131, 170; 326/85, 87
See application file for complete search history.

(56) References Cited

U.S. PATENT DOCUMENTS

| | | | |
|---|---|---|---|
| 4,752,704 A | 6/1988 | Baccarani et al. | 327/388 |
| 5,140,194 A | 8/1992 | Okitaka | 326/86 |
| 5,231,311 A | 7/1993 | Ferry et al. | 326/27 |
| 5,285,116 A | 2/1994 | Thaik | 326/21 |
| 5,483,188 A | 1/1996 | Frodsham | 327/170 |
| 5,621,335 A | 4/1997 | Andresen | 326/30 |
| 5,838,177 A | 11/1998 | Keeth | 327/108 |
| 5,838,186 A * | 11/1998 | Inoue et al. | 327/389 |
| 6,225,844 B1 | 5/2001 | Tsukasa | 327/170 |

(Continued)

FOREIGN PATENT DOCUMENTS

DE    196 04 394    8/1997

(Continued)

OTHER PUBLICATIONS

English Translation of International Preliminary Examination Report for application PCT/EP2002/014067.

*Primary Examiner*—My-Trang Nu Ton
(74) *Attorney, Agent, or Firm*—Fish & Richardson P.C.

(57) ABSTRACT

Circuitry is disclosed for controlling the slope of rising and falling edges of a signal. The circuitry includes a ramp signal generator that receives an input signal and that generates a trapezoidal signal based on the input signal, and a circuit array that receives the trapezoidal signal and that generates control signals based on the trapezoidal signal. Output transistors have gates that receive a set of the control signals. The output transistors include a top transistor and a bottom transistor. The top transistor has a source connected to a supply potential and a drain connected to an output. The bottom transistor has a source connected to a reference potential and a drain connected to the output. The top transistor and the bottom transistor are gated by the control signals to control a shape of an edge of an output signal at the output.

20 Claims, 6 Drawing Sheets

U.S. PATENT DOCUMENTS

| | | | |
|---|---|---|---|
| 6,320,433 B1 * | 11/2001 | Hinterscher | 327/112 |
| 6,380,770 B1 * | 4/2002 | Pasqualini | 327/112 |
| 6,894,547 B1 * | 5/2005 | Takahashi | 327/170 |
| 2001/0030561 A1 | 10/2001 | Asano et al. | 327/170 |

FOREIGN PATENT DOCUMENTS

| | | |
|---|---|---|
| EP | 0 952 668 | 10/1999 |
| JP | 2001016088 | 1/2001 |

* cited by examiner

CIRCUIT ARRANGEMENT FOR THE PROVISION OF AN OUTPUT SIGNAL WITH ADJUSTABLE FLANK PITCH

TECHNICAL FIELD

This application relates to a circuit array for controlling the slope of an edge of an output signal.

BACKGROUND

In integrated circuits, there is normally a need to reduce electromagnetic interference emissions. Steep signal edges lead to relatively large emitted and conducted emissions, especially during operation with high-frequency, digital signals. However, to ensure that electronic systems do not significantly impede the operation of other electronic system, regulatory measures have been imposed, such as the establishment of severity values, which are intended to guarantee the electromagnetic compatibility (EMC) of different systems. Electromagnetic compatibility (EMC) relates to both allowable electromagnetic emissions and required resistance to interference.

One method of reducing high-frequency signal components within the frequency spectrum of a digital signal includes reducing the slopes of rising and falling edges of the digital signals. Therefore, efforts have been made to reduce the slopes of both rising and falling signal edges of digital signals so as to comply with EMC standards or EMC specifications, and to guarantee reliable operation of the circuits.

In the rapid digital signal processing used today, such as in digital signal processors, digital signals are designed to be as fast as possible, often in the range of a hundred picoseconds. This leads to the large, high-frequency spectral component of the signals. In addition, integrated circuits used in fast digital signal processing normally occupy a small amount of surface area on a chip and consume low power during operation.

In U.S. Pat. No. 6,225,844, an output stage is disclosed, which can be operated stably with a relatively small signal slope. The specified output stage comprises two CMOS inverter stages connected in parallel, with respect to their load paths, between a reference potential connection and a supply potential connection. An output signal with reduced edge slope can be obtained from these inverter stages. Whereas the first of the two input stages is directly driven by the input signal, an additional control circuit for influencing signal edge slope is provided to drive the gate electrodes of the transistors of the second transistor inverter stage. This circuit enables the two transistors of the second output stage to be switched on or off in a controlled manner. Because threshold values of the transistors are used to drive the second output stage, the principle described above can only be used to construct a two-stage circuit array.

A circuit array for reducing the edge slope of an output signal is also described in U.S. Pat. No. 5,140,194. In this case, several CMOS inverter output stages are connected in parallel. Delay times are generated to drive the various inverter stages. According to the patent, the delay times are generated with RC time constants. A disadvantage of this approach, however, is that it involves use of resistors having narrow tolerance ranges and that require a relatively large chip surface area. Alternatively, it is also proposed that the RC elements be replaced with delay elements, which are also difficult to implement. The disadvantage remains of having to adjust the time constant individually for each inverter stage on the output end, and of having to implement individually in terms of circuit technology.

Another disadvantage shared by the above-described circuit arrays is that the slope of the output signal is dependent on the characteristics of the input signal.

SUMMARY

One object of this invention is to specify a circuit array for providing an output signal with an edge whose slope is adjustable, which makes it possible to use any number of inverter stages to control the edge slope to any degree of precision, and which further provides an output signal whose edge slope can be adjusted independently of the signal characteristics of the input signal.

According to the invention, the object is achieved by a circuit array for providing an output signal with adjustable edges slopes, comprising:

an input for supplying an input signal, an output for accepting an output signal derived from the input signal, whose edges slope is adjustable, a ramp signal generator, which is coupled with the input of the circuit array on the input end and provides a trapezoid signal at its output, a first pair of output transistors, the controlled paths of which are coupled with the output of the circuit array, on the one hand, and with a supply or reference potential connection, on the other, and each having a control connection which is coupled with the output of the ramp signal generator, using two switching thresholds, and a second pair of output transistors, the controlled paths of which are coupled with the output of the circuit array, on the one hand, and with a supply or reference potential connection, on the other, and each having a control connection which is coupled with the output of the ramp signal generator, using two additional switching thresholds.

Each of the pairs of output transistors preferably comprises two complementary transistors. These transistors are complementary with respect to their conductivity type, for example, an n-channel and a p-channel field effect transistor is provided in each case.

The term "pair of output transistors", in this context, refers to two output transistors which together form an output stage, but are preferably not driven jointly at their control electrodes, but independently from one another.

Preferably, three or more output stages are provided, each of which comprises two output transistors.

The controlled paths of the output transistors, which together form a pair, are preferably connected in series. These series connections are connected in parallel with one another. The connection nodes of the controlled paths of the output transistors, which together form a pair, are preferably connected to one another and to the output of the circuit array.

According to this arrangement, the ramp signal generator controls the input and output behavior of the first and second pair of output transistors via the trapezoid signal. Additional transistors, e.g., third, fourth, etc. may be controlled by the ramp signal generator. A shared trapezoid signal generated by the shared ramp signal generator is used for the first and second pair of output transistors, as well as for any other number of additional pairs of output transistors.

The output signal of the ramp generator is a trapezoid signal with relatively small slope, both in its rising and in its falling signal edges.

Characteristics of the trapezoid signal, especially its edge slope, are independent of the input signal, including the edge slope of the input signal.

An output signal with an adjustable edge slope can be generated with this circuit array. Using the independently adjustable switching thresholds of the transistors of the output signals, which are individually switched on or off in dependence on the signal progression of the ramp signal, a desired switching sequence and desired switching delays can be set precisely and independently of the progression of the input signal of the circuit array. In particular, sequential switching of the output transistors with the trapezoid signal can prevent the occurrence of unwanted transverse currents. Accordingly, the present principle allows for the operation of circuits in integrated circuit technology at high signal speeds with, at the same time, relatively low and, especially, adjustable electromagnetic emissions, because reduction of the edge slope, which is adjustable, results in the reduction of both the high-frequency signal components in the spectrum of the digital signals and the related, high-frequency electromagnetic emissions. To operate the present circuit array with adjustable edge slope, a large number of expensively implemented delay elements are unnecessary.

According to an advantageous embodiment of the present circuit array, pairs of pre-drivers are provided to supply the desired switching thresholds to couple the ramp signal generators with the first and second pair of output transistors. Advantageously, the switching thresholds can be adjusted differently, both for the output transistors within a pair of output transistors and between the pairs of output transistors, and are activated during operation by the trapezoid signal.

Preferably, one pre-driver is assigned to each output transistor.

The pre-drivers are preferably formed as inverters.

To combine a necessary driver power with a small threshold, as can be provided with some of the output transistors of the circuit array, several inverters can preferably be connected in series to form a pre-driver.

According to the described principle, the inverters of the pre-drivers are switched on and off sequentially by means of the trapezoid signal with a ramp-shaped progression. The pre-drivers themselves drive the output transistors.

Alternatively, the pre-drivers can also be formed as Schmitt triggers, for example, or any other circuit element that provides a trapezoidal signal.

In the described circuit array, controllable switches can be provided to rapidly switch off the output transistors, which, with their controlled paths, connect a control connection of the output transistors to the reference or supply potential connections. The controllable switches allow a rapid shutdown of the correspondingly assigned output transistors and thus an especially short delay time of the output signal of the circuit array relative to the input signal. When augmented in this manner, the circuit array is especially suitable for rapid digital signal processing.

The controllable switches are preferably connected via their control electrodes to the input of the circuit array, such as the input of the ramp signal generator.

An especially rapid connection of the input of the circuit array with the output, involving an especially short signal run time in the circuit array, can be achieved, in accordance with a preferred embodiment of the circuit array, in that, in a third pair of output transistors, the controlled paths are coupled with the output of the circuit array, on the one hand, and with the supply or reference potential connection, on the other, while each of the control connections of the output transistors of the third pair has a control connection which is coupled with the input of the ramp signal generator to supply the input signal.

Accordingly, the third pair of output transistors is not driven by the trapezoid signal of the ramp signal generator, but directly by the input signal itself.

The ramp signal generator preferably comprises a capacitive component, which, as a result of charging and discharging effects, determines the signal ramp of the ramp-shaped signal in terms of its time progression, especially its edge slope. To this end, the ramp signal generator can have a flip-flop structure, for example. With a ramp signal generator constructed in this fashion, a ramp progression of the trapezoid signal is preferably achieved which is independent of the progression of the input signal.

According to a further embodiment of the present circuit array, the capacitance of the capacitive component of the ramp signal generator can be designed to be adjustable, as varactor diodes, for example. Alternatively, a combination of different, fixed capacitances can be provided, which can be switched on and off. They can be implemented as internal or as external capacities.

As a result, an additional means of adjusting the output signal of the circuit array can be achieved through adjustable progression of the trapezoid signal.

Additional details and advantageous embodiments of the invention are the subject of the dependent claims.

In the following, the invention is described in greater detail on the basis of several exemplary embodiments shown in the drawings:

DESCRIPTION OF THE DRAWINGS

FIG. 1b shows the progression of the trapezoid signal for driving the output transistors shown in FIG. 1a.

FIG. 3 shows the time progressions of the input signal and output signal of a circuit array shown in FIG. 1a.

FIG. 5b shows the progression of a trapezoid signal for driving the output transistors shown in FIG. 5a.

FIG. 6b shows the progression of a trapezoid signal for driving the output transistors shown in FIG. 6a.

DETAILED DESCRIPTION

Figure 1A:
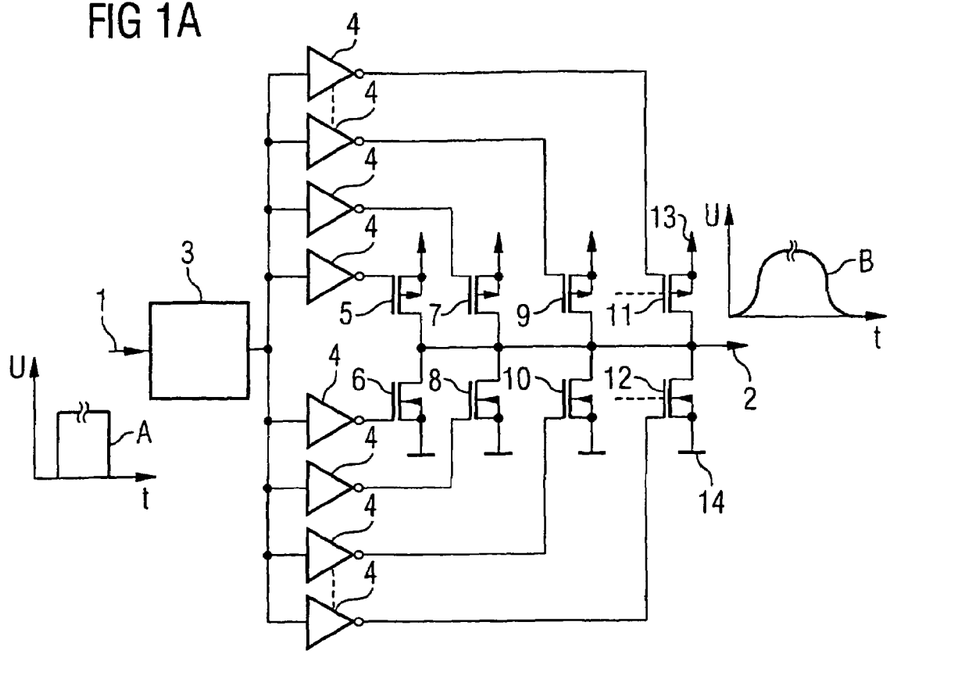
FIG. 1a shows, using a simplified block diagram, a first exemplary embodiment of a circuit array according to the invention for providing an output signal with an adjustable edge slope.

FIG. 1a shows a circuit array for providing an output signal B with an adjustable edge slope, comprising an input 1 for supplying an input signal A and an output 2 for measuring an output signal B derived from the input signal A, whose edge slope is adjustable. The circuit array also comprises a ramp signal generator 3, the input of which is coupled with the input 1 of the circuit array on the input end and which provides, at its output, a trapezoid signal C with a relatively gradually rising and gradually falling signal edge, both exhibiting a ramp-shaped progression.

The output of the ramp signal generator 3 is connected to each of the inputs of a plurality of pre-drivers 4 formed as inverters. The inverters 4 have different switching thresholds. Each of the outputs of the pre-drivers 4 is connected to a gate connection of a metal oxide semiconductor (MOS) field effect transistor. Pairs of complementary MOS transistors 5, 6; 7, 8; 9, 10; 11, 12 form pairs of output transistors, such that each pair of output transistors forms an inverter stage. Each of the inverter stages on the output end comprises a p-channel transistor 5, 7, 9, 11, the load path of which couples a supply potential connection 13 with the output 2 of the circuit and an N-channel-MOS transistor 6, 8, 10, 12, the load path of which connects the output 2 with a reference potential connection 14.

Figure 1B:
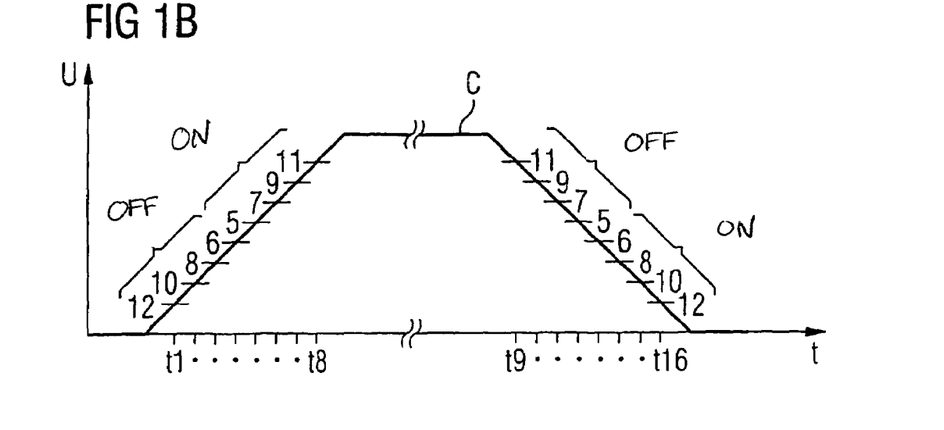

The mode of operation of the circuit shown in FIG. 1a is explained in the following on the basis of a signal progression of the voltage of the ramp-shaped signal C, as shown in FIG. 1b, which is supplied at the output end of the ramp signal generator 3, and the time progression of which, especially its edge slope, is dependent on the input signal A. The trapezoid signal C sequentially switches the plurality of inverter stages 4 used as pre-drivers on and off, depending on the signal voltage and the switching thresholds of the inverters. The pre-drivers 4, in turn, drive the output transistors 5 to 12. The signal progression of the trapezoid signal C exhibits reversing thresholds of the inverters 4, which, for this purpose, are differently configured based on the reference symbols of the transistors 5 to 12 shown in FIG. 1a, which are assigned to the inverters 4, at various times t1 to t16.

In the circuit schematic shown in FIG. 1a, the area ratios of the output transistors 5 to 11 as well as 6 to 12 increase from left to right, which is synonymous with the output transistors 11, 12 having the highest current driver capacitance, and the output transistors 5, 6 having the lowest current driver capacitance. Thus, the effective transistor areas of the output transistors are designed to be sloped in pairs relative to one another, the objective being to achieve the smoothest possible transition in the output signal B from a low to a high signal level, and vice-versa.

The benefit of driving the output transistors 5 to 12 via pre-drivers 4 with different switching thresholds by a shared trapezoid signal C is that, on the one hand, a plurality of output stages, i.e., output transistors, can be provided, depending on the desired accuracy of adjustment of the output signal B relative to its edge slope, and that, on the other hand, a structure with a small chip area is possible and that, finally, the edge progression of the output signal B is independent of that of the input signal A, because signal progression of the trapezoid signal C is always constant and adjustable.

The pre-driver inverters 4, which drive the output transistors 5 to 12, are designed to have different threshold voltages. Each inverter 4 is switched on when the voltage level of the trapezoid signal 3 reaches its preset voltage threshold value, and is switched off again when the voltage level of the trapezoid signal C falls below this preset threshold voltage. The threshold voltages of the inverters, which drive the P-channel transistors 5, 7, 9, 11, are set to different values than the threshold voltages of those inverters 4 that drive the N-output transistors 6, 8, 10, 12, the purpose being to avoid transverse currents. As explained earlier, instead of one inverter 4, a plurality of inverters connected in series can be provided, such as three inverters connected in series, the input-end inverter being designed to generate the desired threshold voltage and the output-end inverter to drive the output transistor that is connected to it.

Another advantage can be achieved by designing the output-end inverter 4 to be especially small relative to its transistor area. This results in an additional reduction in the edge slope of the output signal B, because the gate connection of the corresponding output transistor 5 to 12 is charged relatively slowly. This forces the output transistor 5 to 12 to allow an extended period of time to pass until the output transistor has been completely connected.

The size, that is, the transistor areas and, therefore, the driver capacitance of the output transistor pairs 5, 6; 7, 8; 9, 10; 11, 12 relative to one another are configured differently. The output transistor pair 5, 6 has the smallest effective transistor area. The adjacent output transistors 7 have a larger transistor area than the transistors 5, 6, and, in turn, the output transistors 9, 10 have a larger effective area than the output transistors 7, 8, and so on. When the output signal is switched on, i.e., when there is a transition from low to high, the output transistors 12, 10, 8, 6 are switched off consecutively, beginning with the largest. Then the output transistors 5, 7, 9, 11 are switched off consecutively, beginning with the smallest output transistor. The result of connecting a smaller output transistor 5, 6 is that a smaller transistor requires more time to charge and discharge an external load capacitance than a large one. In each output stage 5, 6; 7, 8; 9, 10; 11, 12, an external load is charged or discharged a little further, until the output voltage at the output 2 reaches the desired voltage level assigned to the corresponding logic level, high or low.

As mentioned earlier, the advantage of sequentially switching the output transistors 5 to 12 on and off is that transverse currents are reduced to a minimum. In addition to reducing the electromagnetic emission of the circuit, this also reduces the power consumption of the circuit.

For example, if the output signal B is to increase from a low to a high level, the trapezoid signal C, which drives the output transistors 5 to 12 via the inverters 4, also moves from low to high. This signal ramp increases gradually over time, finally reaching the threshold voltages of the inverters 4. The threshold voltage of the inverter 4 assigned to the largest N-channel output transistor 12 is reached first.

This output transistor 12 switches off. Then the trapezoid signal C reaches the threshold voltage of the next smaller N-channel transistor 10, and transistor 10 also switches off. In the same manner, output transistors 8 and 6 are switched off consecutively, until all N-channel output transistors are switched off. As the trapezoid signal C increases further, the threshold voltage of the inverter 4 assigned to the smallest P-channel transistor 5 is reached and output transistor 5 is switched on. Subsequently, the threshold voltage of the next larger P-channel transistor 7 is reached, and it too switches on. Then the P-channel output transistors 9 and 11 are switched on, and the process continues until all P-channel output transistors are switched on. The total driver capacitance that is capable of converting a load connected to an output 2 to a high level is defined as the sum of the transistor areas of all P-channel output transistors of the circuit, and the driver capacitance in the low state is defined as the sum of the transistor areas of all N-channel transistors.

Driving the output signal B from high to low occurs analogously. In this process, first the P-channel output transistors are connected in sequence and then the N-channel output transistors are connected in sequence. The sequential switching on of transistors with increasing transistor area leads to a gradually rising or falling edge of the output signal B. A significant advantage over known output drivers is that, in the present principle, the peak current for charging and discharging external loads is divided into a plurality of current branches, which drive a relatively low current. In addition to the relatively low load current of the individual output transistors, another advantage is that the longer amount of time needed to switch the output 2 leads to a lower current gradient di/dt, thereby reducing the emission of electromagnetic energy from integrated semiconductor circuits. Another advantage lies in the reduced overshooting of the output signal by the drive shown.

Figure 2:
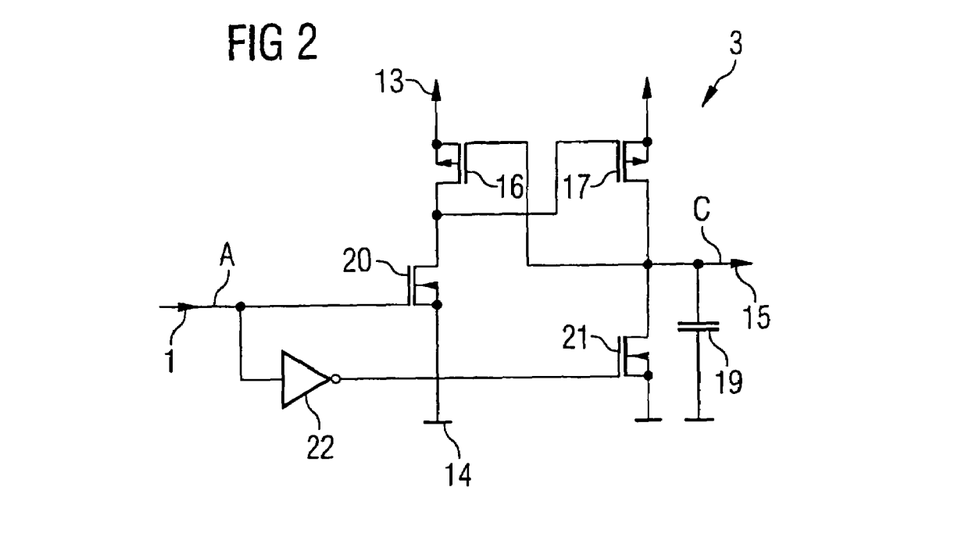
FIG. 2 shows an exemplary embodiment of a ramp signal generator shown in FIG. 1a, using a circuit schematic.

FIG. 2 shows the circuit schematic of a possible structure of the ramp signal generator 3 from FIG. 1a. The input signal A is supplied to the ramp signal generator 3 at the input 1. The ramp signal generator 3 supplies the trapezoid signal C at its output 15. The ramp signal generator 3 comprises two transistors 16, 17 cross-coupled with one another, which are formed as p-channel-MOS transistors, one end of their load paths being coupled with the supply potential connection 13. The transistor 17 is connected to the reference potential connection 14 through a capacitor 19. The control connection of the gate connection of the transistor 16 is connected to a load connection of the transistor 17, while the control connection of the transistor 17 is connected to a load connection of the transistor 16. In parallel to the capacitor 19, a switching transistor 21 is connected to its load path, its controlled path being coupled with the input 1. In this process, the input signal A is supplied to the control connection of the transistor 20 in unchanged form, whereas the input signal A is supplied to the control connection of the transistor 21 in inverted form. To this end, an inverter 22 is connected between the input 1 and the control connection of the transistor 21.

The underlying principle of the circuit of the ramp signal generator is to charge the load capacitor 19 with a constant current. The capacitor 19 does not necessarily have to be designed as external capacitors, but can preferably be designed as a gate capacitor of MOS transistors. The capacitor 19 is charged by means of the PMOS transistor 17 and discharged by means of the NMOS transistor 21, which is connected in parallel to the capacitor 19. Thus, the circuit shown in FIG. 2 corresponds to a flip-flop principle. Advantageously, the ramp signal generator 3 exhibits no or only very little quiescent current. Current only flows when the capacitor 19 is charged or discharged. In addition, the ramp signal generator 3 advantageously exhibits low current consumption.

Figure 3:
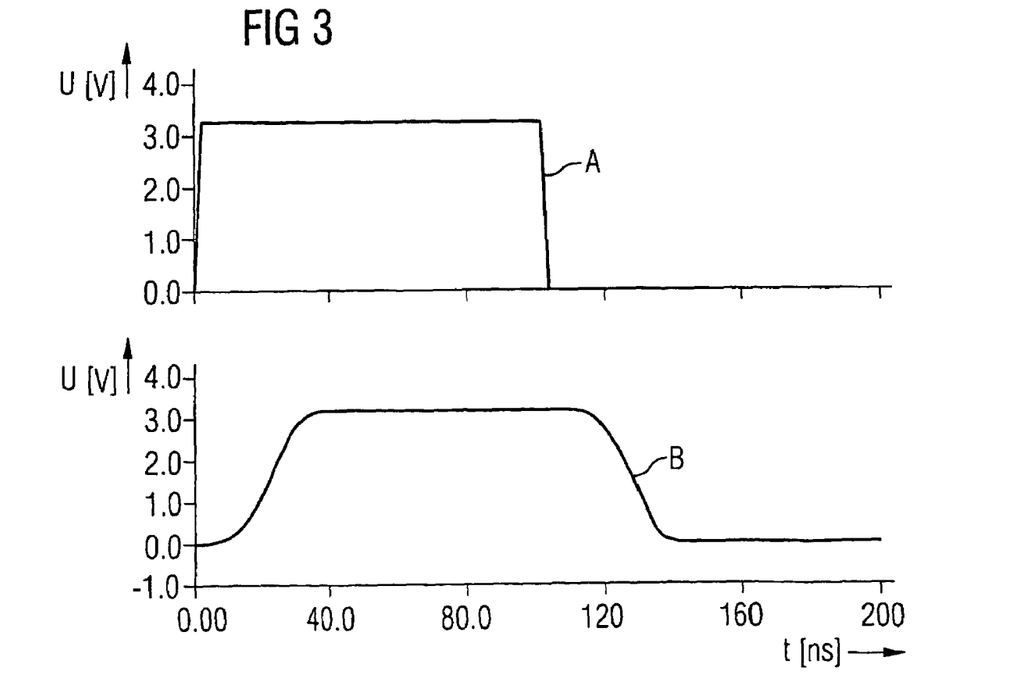

FIG. 3 shows, based on the progressions of the signal voltage over time, the output signal A, with a rising and a falling edge, and the output signal B, also on the basis of a rising and falling edges. It is evident that the desired effect is achieved with the present circuit, namely a relatively slow rise in the signal edge and a relatively slow fall in the signal edge, with soft transitions and little overshoot, as well as a relatively short delay time.

Figure 4:
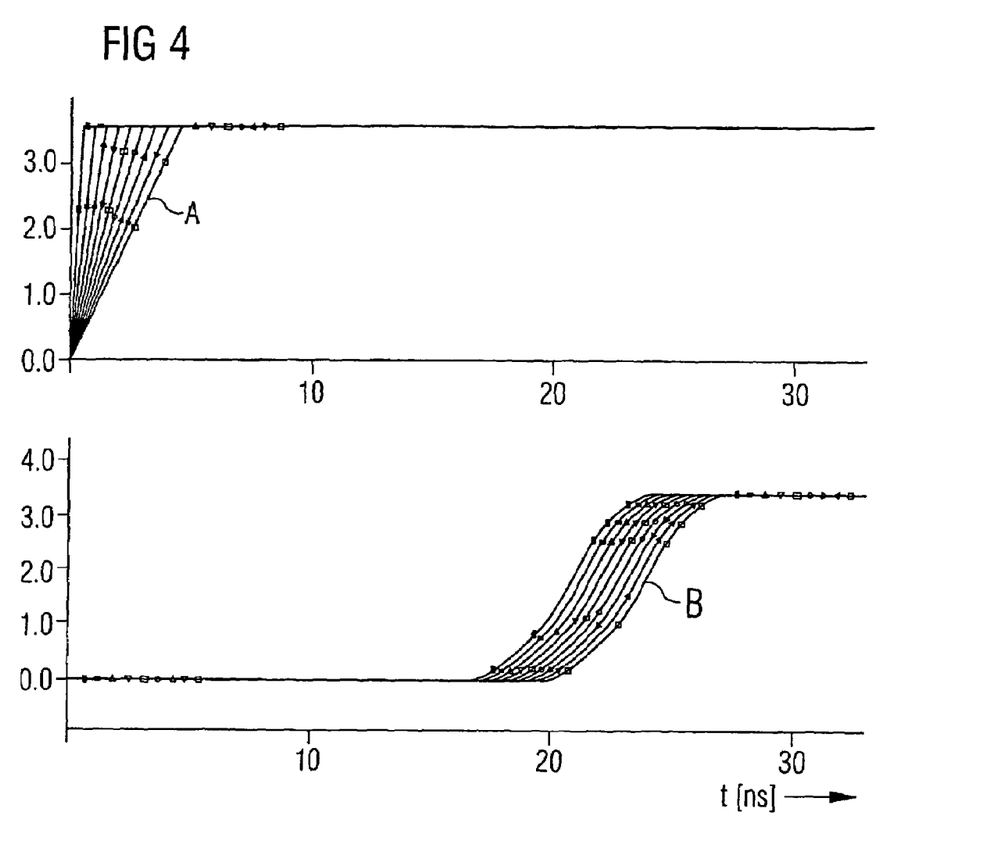
FIG. 4 shows the depiction shown in FIG. 3, but based on a group of curves with an adjustable edge slope for the input signal relative to the rising signal edge.

FIG. 4 shows, also based on the progressions of the signal voltage over time, a diagram of the rising edge of the input signal A and, below it, at very high chronological resolution, the rising edge of the output signal B according to the present principle. The signal progressions of the input and output signal A, B are shown as a group of curves, wherein the pitch of the rising edge of the input signal A is selected as the grouping parameter. It is clearly evident that, regardless of the edge of the input signal A, the progression of the rising edge of the output signal B is equal in each case and, in particular, has the same edge slope. Only the delay time is slightly dependent on the edge slope of the input signal A.

Figure 5A:
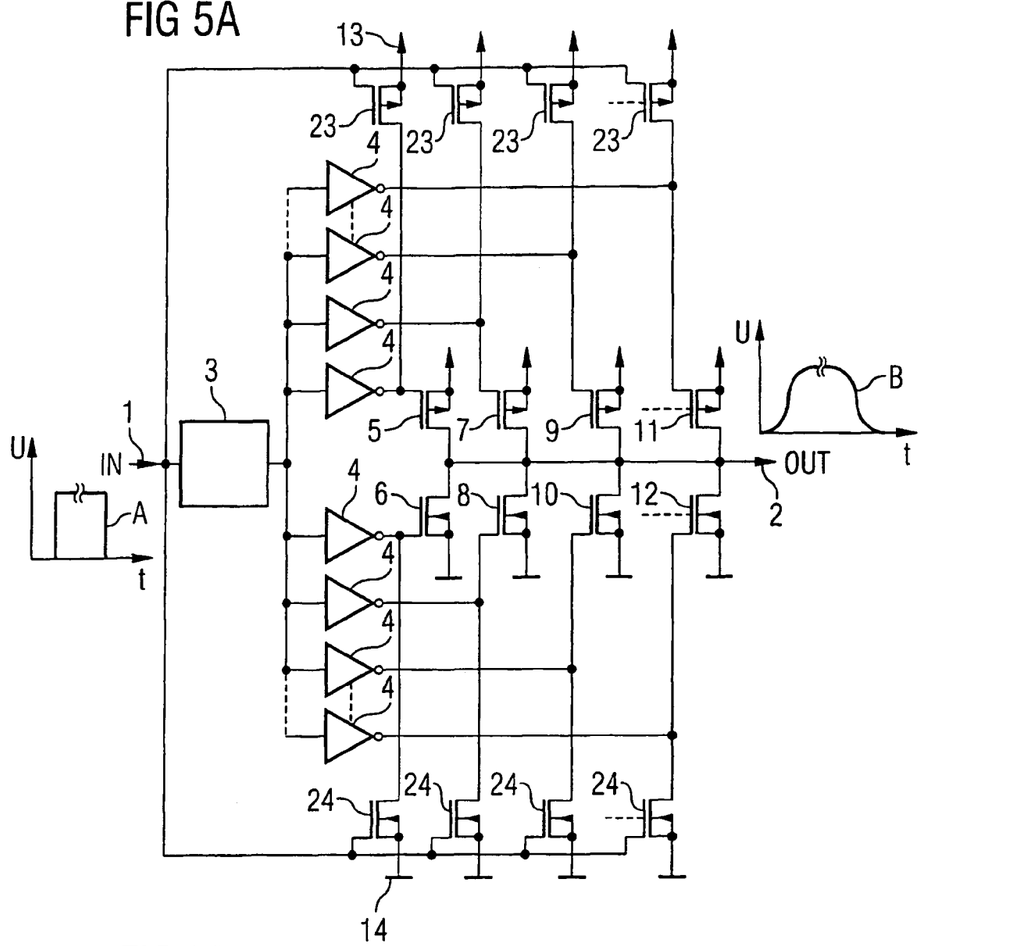
FIG. 5a shows a further embodiment of the circuit array shown in FIG. 1a, with rapid shutoff.

FIG. 5a shows a further embodiment of the circuit shown in FIG. 1a. In terms of its structure and advantageous mode of operation, it essentially corresponds to that shown in FIG. 1a. In addition to the components shown in FIG. 1a, however, it has transistors for rapidly switching off 23, 24 the output transistors 5 to 12. Each PMOS transistor 23 for rapidly switching off the PMOS output transistors 5, 7, 9, 11 is connected to the input 1 through its control connection and, through its load path, to the supply potential connection 13, on the one hand, and to the control connection of each corresponding output transistor 5, 7, 9, 11. In addition, an NMOS cutoff transistor 24 is assigned to each NMOS output transistor 6, 8, 10, 12, its controlled paths being connected to the reference potential connection 14, on the one hand, and to one control input of each of the corresponding N-channel output transistors 6, 8, 10, 12, on the other, and its control connections being connected to the input 1 of the circuit.

An advantage offered by the further embodiment according to FIG. 5a, with its cutoff transistors 23, 24, is that an especially low delay time of the output signal B relative to the input signal A is achieved with relatively little effort.

Figure 5B:
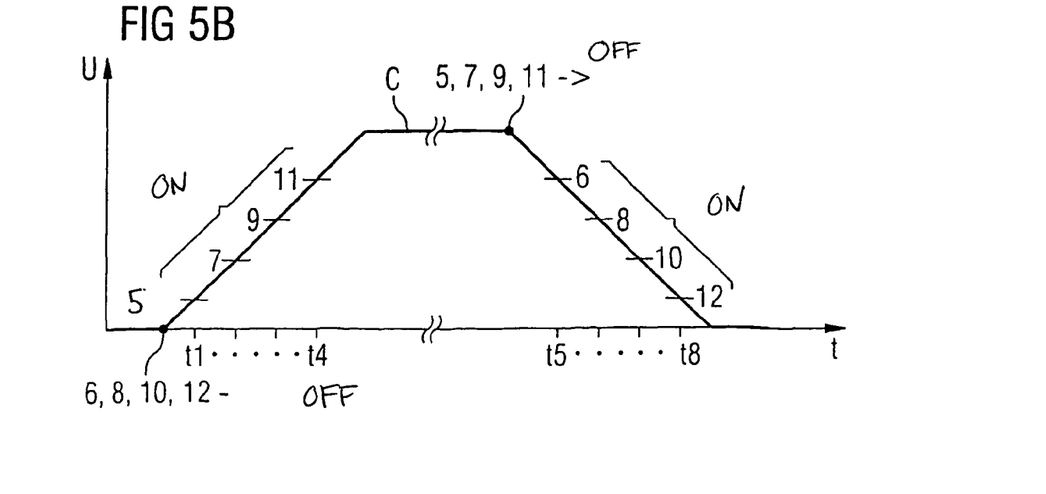

FIG. 5b shows the progression of the trapezoid signal C for driving the circuit shown in FIG. 5a essentially corresponding to the signal progression of FIG. 1b. Only the reversing thresholds of the inverters 4 assigned to the transistors 5 to 12 and the times t1 to t8 are adjusted to the further embodiment with the cutoff transistors 23, 24 according to FIG. 5a.

Figure 6A:
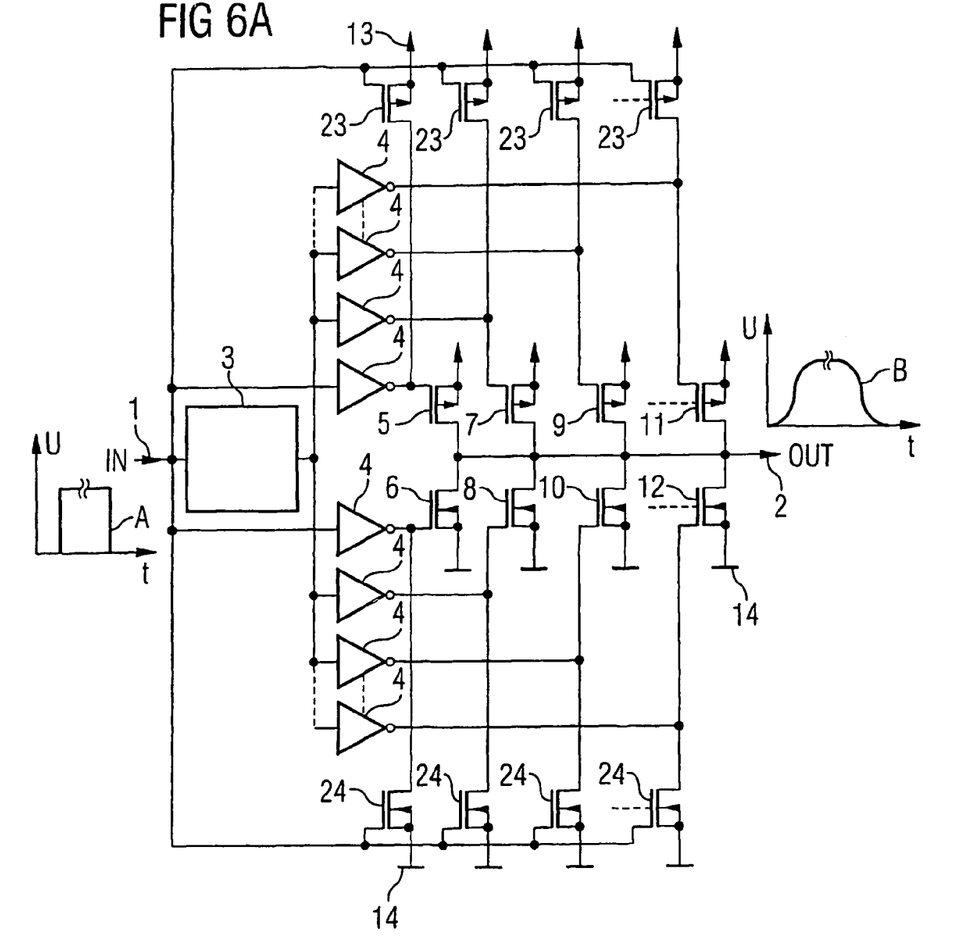
FIG. 6a shows a further embodiment of the circuit array shown in FIG. 5a for shorter signal run times.

FIG. 6a shows a further embodiment of the circuit according to FIG. 5a, essentially corresponding to it in terms of structure and function. Only in terms of the driving of the output transistors 5, 6, which have the smallest transistor areas of all output transistors 5 to 12, does FIG. 6a differ, advantageously, from the circuit according to FIG. 5a. In this case, the inputs of the inverters 4, which are assigned to the output transistors 5, 6 for the purpose of driving them, are not connected to the output of the ramp signal generator 3, but with the input of the ramp signal generator 3 and thus with the input 1 of the circuit. In the circuit according to FIG. 6a, the inverters 4 assigned to the remaining output transistors 7 to 12 are, as explained above, also connected to the output of the ramp signal generator 3. This allows for an even greater reduction in signal run times and phase delays of the output signal B relative to the input signal A.

Figure 6B:
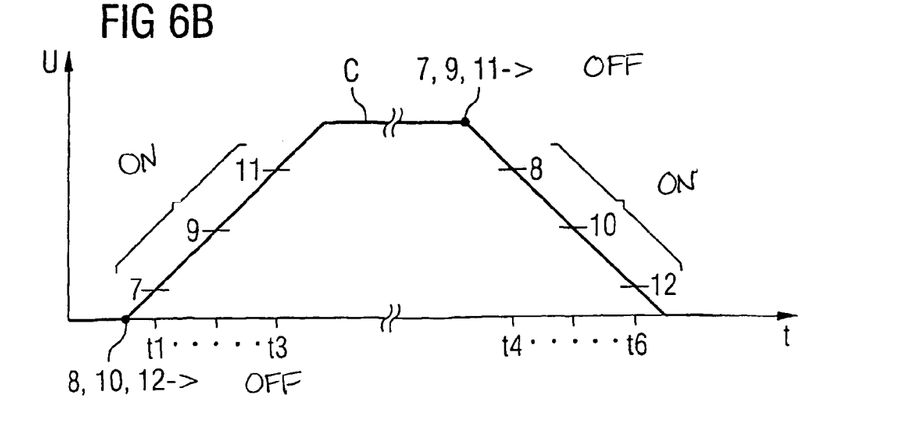

The diagram in FIG. 6b shows the progression of the trapezoid signal C over time t based on the signal voltage, which essentially corresponds to the depiction of the trapezoid signal C in FIGS. 1b and 5b. Only the reversing thresholds of the inverters 4 assigned to the transistors 7 to 12 and the times t1 to t6 are adjusted to the further embodiment with cutoff transistors 23, 24 shown in FIG. 6a, as well as to the third output transistors 5, 6 being directly driven by the input signal A.

In the circuits shown in FIGS. 5a and 6a, the output transistors 5 to 12 are switched on and off sequentially, as in the circuit shown in FIG. 1a. The further embodiment with the rapid cutoff transistors 23, 24 shown in FIGS. 5a and 6a allows for rapid cutoff, so that, advantageously, a more rapid succession of the switching actions of the output transistors can occur, because transverse currents cannot flow because of the rapid cutoff.

Figure 7:
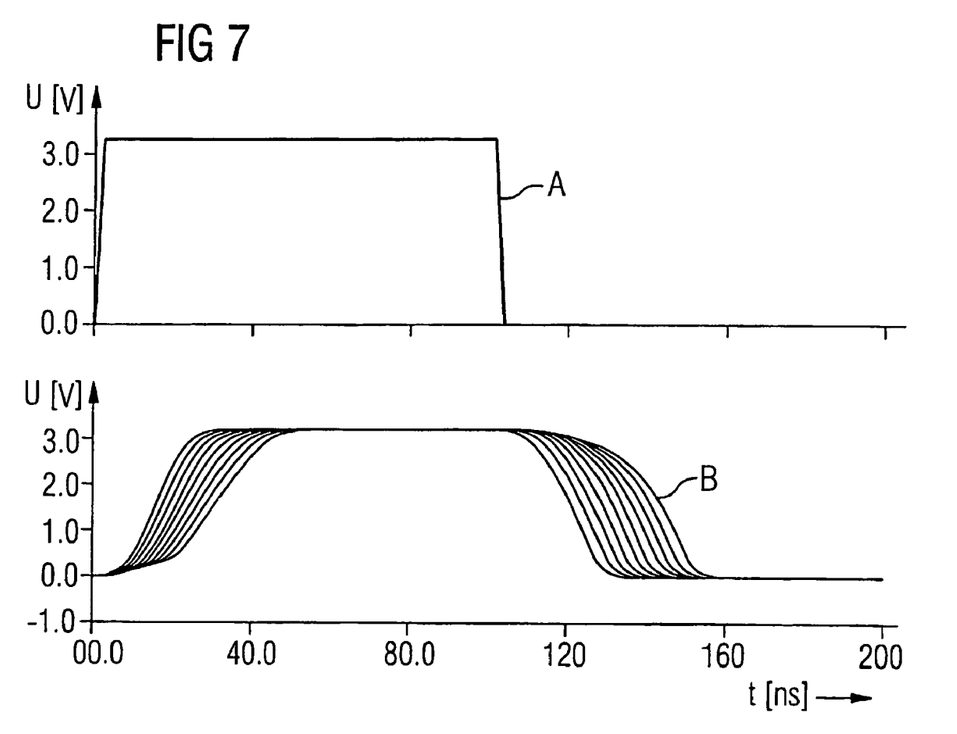
FIG. 7 shows time progressions of the input signal and output signal when the capacitance in the ramp signal generator is changed.

FIG. 7 shows the signal progression of the voltage of the output signal B, using a group of curves, as a factor of the signal progression of the voltage of the input signal A in a circuit according to FIGS. 1a, 5a or 6a, based on a simulation. However, the capacitance, as the grouping parameter, of the capacitive component 19 of the ramp signal generator shown in FIG. 2 is varied. The output signal B with the steepest edge slope is accepted at the smallest capacitance and that with the smallest edge slope at the largest capacitance. Between these extremes, the capacitance was increased in discrete steps.

The invention claimed is:

1. Circuitry comprising:
   a ramp signal generator to receive an input signal and to generate a trapezoidal signal based on the input signal;
   a circuit array to receive the trapezoidal signal and to generate control signals based on the trapezoidal signal;
   first output transistors having gates to receive a first set of the control signals, the first output transistors comprising a first top transistor and a first bottom transistor, the first top transistor having a source connected to a supply potential and a drain connected to an output, the first bottom transistor having a source connected to a reference potential and a drain connected to the output, the first top transistor and the first bottom transistor being gated by the first set of control signals to control a shape of an edge of an output signal at the output; and
   second output transistors having gates to receive a second set of the control signals, the second output transistors comprising a second top transistor and a second bottom transistor, the second top transistor having a source connected to the supply potential and a drain connected to the output, the second bottom transistor having a source connected to the reference potential and a drain connected to the output, the second top transistor and the second bottom transistor being gated by the second set of control signals to control the shape of the edge of the output signal.

2. The circuitry of claim 1, wherein the circuit array comprises pre-drivers, and each of the first and second output transistors has a switching threshold that is met by a control signal provided by one of the pre-drivers.

3. The circuitry of claim 2, wherein the pre-drivers comprise at least one of inverters and a circuit element that produces an adjustable switching threshold.

4. The circuitry of claim 1, further comprising:
   controllable switches to switch off the first and second output transistors by connecting the gates of the first and second output transistors to either the reference potential or the supply potential.

5. The circuitry of claim 4, wherein each of the controllable switches comprises a transistor having a gate that is connected to input signal.

6. The circuitry of claim 1, further comprising:
   third output transistors having gates to receive an inversion of the input signal, the third output transistors comprising a third top transistor and a third bottom transistor, the third top transistor having a source connected to the supply potential and a drain connected to the output, the third bottom transistor having a source connected to the reference potential and a drain connected to the output, the third top transistor and the third bottom transistor being gated by the inversion of the input signal.

7. The circuitry of claim 1, wherein the trapezoidal signal has an edge with a shape that is independent of the input signal.

8. The circuitry of claim 7, wherein the ramp signal generator comprises a capacitive component for controlling a shape of rising and falling edges of the of the trapezoidal signal.

9. The circuitry of claim 8, wherein the capacitance of the capacitive component is adjustable.

10. The circuitry of claim 1, wherein areas of the first and second output transistors are of different sizes.

11. The circuitry of claim 1, wherein the shape comprises a slope of the edge of the ouput signal.

12. The circuitry of claim 11, wherein the edge comprises at least one of a rising edge of the output signal and a falling edge of the output signal.

13. Circuitry for adjusting a slope of an edge of an output signal, the circuitry comprising:
    a ramp signal generator to output a trapezoidal signal;
    drivers to respond to the trapezoidal signal by outputting control signals, the drivers having different switching thresholds;
    a set of top transistors, each of the top transistors comprising a gate to receive a control signal from a corresponding driver, a source connected to a supply potential, and a drain connected to an output; and
    a set of bottom transistors, each of the bottom transistors comprising a gate to receive a control signal from a corresponding driver, a source connected to a reference potential, and a drain connected to the output;
    wherein, at a rising edge of the trapezoidal signal, drivers corresponding to the bottom transistors are operable to output control signals to sequentially deactivate the bottom transistors and then drivers corresponding to the top transistors are operable to output control signals to sequentially activate the top transistors.

14. The circuitry of claim 13, wherein the bottom transistors are sequentially deactivated starting with a transistor having a largest effective area and proceeding to a transistor having a smallest effective area.

15. The circuitry of claim 13, wherein the top transistors are sequentially activated starting with a transistor having a smallest effective area and proceeding to a transistor having a largest effective area.

16. The circuitry of claim 13, wherein, at a falling edge of the trapezoidal signal, drivers corresponding to the top transistors output control signals to sequentially deactivate the top transistors and then drivers corresponding to the bottom transistors output control signals to sequentially activate the bottom transistors.

17. The circuitry of claim 16, wherein the bottom transistors are sequentially activated starting with a bottom transistor having a smallest effective area and proceeding to a bottom transistor having a largest effective area.

18. The circuitry of claim 16, wherein the top transistors are sequentially deactivated starting with a top transistor having a largest effective area and proceeding to a top transistor having a smallest effective area.

19. The circuitry of claim 13, wherein the top transistors comprise P-channel transistor and the bottom transistors comprise N-channel transistors.

20. Circuitry comprising:
    a ramp signal generator to receive an input signal and to generate a trapezoidal signal based on the input signal;
    a circuit array to receive the trapezoidal signal and to generate control signals based on the trapezoidal signal;
    first output transistors having gates to receive a first set of the control signals, the first output transistors comprising a first top transistor and a first bottom transistor, the first top transistor having a source connected to a supply potential and a drain connected to an output, the first bottom transistor having a source connected to a reference potential and a drain connected to the output, the first top transistor and the first bottom transistor being gated by the first set of control signals to control a shape of an edge of an output signal at the output; and second output transistors having gates to receive a second set of the control signals, the second output transistors comprising a second top transistor and a second bottom transistor, the second top transistor having a source connected to the supply potential and a drain connected to the output, the second bottom transistor having a source connected to the reference potential and a drain connected to the output, the second top transistor and the second bottom transistor being gated by the second set of control signals to control the shape of the edge of the output signal;

wherein the circuit array comprises first pre-drivers to generate control signals for the first output transistors and second pre-drivers to generate control signals for the second output transistors; and wherein at least two of the first and second output transistors have different switching thresholds, or at least two of the first and second pre-drivers have different switching thresholds.

* * * * *